US010007579B2

(12) United States Patent
Shaw et al.

(10) Patent No.: US 10,007,579 B2
(45) Date of Patent: Jun. 26, 2018

(54) MEMORY BACKUP MANAGEMENT IN COMPUTING SYSTEMS

(71) Applicant: Microsoft Technology Licensing, LLC, Redmond, WA (US)

(72) Inventors: Mark A. Shaw, Sammamish, WA (US); Scott Chao-Chueh Lee, Bellevue, WA (US); Sriram Govindan, Redmond, WA (US); Bryan Kelly, Carnation, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 147 days.

(21) Appl. No.: 15/067,644

(22) Filed: Mar. 11, 2016

(65) Prior Publication Data

US 2017/0262344 A1 Sep. 14, 2017

(51) Int. Cl.
| | | |
|---|---|---|
| *G06F 11/00* | (2006.01) | |
| *G06F 11/14* | (2006.01) | |
| *G06F 3/06* | (2006.01) | |
| *G11C 11/406* | (2006.01) | |
| *G06F 13/40* | (2006.01) | |
| *G06F 11/10* | (2006.01) | |

(52) U.S. Cl.
CPC .......... *G06F 11/1464* (2013.01); *G06F 3/065* (2013.01); *G06F 3/068* (2013.01); *G06F 3/0619* (2013.01); *G06F 3/0653* (2013.01); *G06F 3/0656* (2013.01); *G06F 11/1076* (2013.01); *G06F 13/4022* (2013.01); *G11C 11/40615* (2013.01); *G06F 2201/84* (2013.01)

(58) Field of Classification Search
USPC ....................................................... 714/6.21
See application file for complete search history.

(56) References Cited

U.S. PATENT DOCUMENTS

| 6,336,174 B1 * | 1/2002 | Li ...................... G06F 11/1441 365/228 |
| 7,127,638 B1 | 10/2006 | Sardella et al. |
| 7,321,990 B2 | 1/2008 | Zimmer et al. |
| 7,594,144 B2 | 9/2009 | Brandyberry et al. |
| 7,830,732 B2 | 11/2010 | Moshayedi et al. |

(Continued)

OTHER PUBLICATIONS

"International Search Report and Written Opinion Issued in PCT Application No. PCT/US2017/020553, dated May 29, 2017", 14 Pages.

(Continued)

*Primary Examiner* — Sarai E Butler
(74) *Attorney, Agent, or Firm* — Liang IP, PLLC

(57) ABSTRACT

Embodiments of memory backup management in computing devices and associated methods of operations are disclosed therein. In one embodiment, a method of managing memory backup includes in response to a system error being detected, causing a memory controller to disengage from communicating with and controlling a hybrid memory device having a volatile memory module and a non-volatile memory module. The method can also include causing the hybrid memory device to copy data from the volatile memory module to the non-volatile memory module subsequent to disengaging the memory controller communicating with and controlling the storage device and without operating the main processor and the memory controller.

15 Claims, 8 Drawing Sheets

(56) References Cited

U.S. PATENT DOCUMENTS

| | | |
|---|---|---|
| 8,024,609 B2 | 9/2011 | Suffern |
| 8,189,328 B2 | 5/2012 | Kanapathippillai et al. |
| 8,468,317 B2 | 6/2013 | Steed |
| 8,566,639 B2 | 10/2013 | Moshayedi et al. |
| 8,595,723 B2 | 11/2013 | Garrett et al. |
| 8,954,619 B1 | 2/2015 | DeCesaris et al. |
| 2003/0158933 A1* | 8/2003 | Smith ............... H04L 1/22 709/224 |
| 2010/0202239 A1 | 8/2010 | Moshayedi et al. |
| 2013/0067156 A1 | 3/2013 | Cho |
| 2013/0142001 A1 | 6/2013 | Sweere et al. |
| 2014/0006764 A1 | 1/2014 | Swanson et al. |
| 2014/0201301 A1 | 7/2014 | Bradley et al. |
| 2014/0298082 A1* | 10/2014 | Rikitake ............ G06F 11/2215 714/4.11 |
| 2015/0046615 A1 | 2/2015 | DeCesaris et al. |

OTHER PUBLICATIONS

Ongaro, et al., "Fast Crash Recovery in RAMCloud", In Proceedings of the Twenty-Third ACM Symposium on Operating Systems Principles, Oct. 23, 2011, 13 pages.

* cited by examiner

MEMORY BACKUP MANAGEMENT IN COMPUTING SYSTEMS

BACKGROUND

Servers in cloud computing datacenters can utilize non-volatile dual in-line memory modules ("NVDIMMs") or other hybrid memory devices to achieve high application performance, good data security, and low system crash recovery time. Certain types of NVDIMMs (e.g., NVDIMM-Ns) can include a dynamic random access memory ("DRAM") module operatively coupled to a flash memory module. The DRAM module allows fast memory access while the flash memory module can persistently retain data upon unexpected power losses, system crashes, or normal system shutdowns.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In certain computing devices, data backup and persistence operations in NVDIMMs rely heavily on availability of other motherboard components. For example, when a server experiences a system error, a main processor of the server can instruct a corresponding memory controller to flush a buffer of the memory controller and write any data still in the buffer to the NVDIMMs. The memory controller can then command the NVDIMMs to switch to self-refresh mode before the server provides a signal (e.g., a voltage signal) to an input pin (e.g., the SAVE# pin) on the NVDIMMs to initiate data backup in the NVDIMMs. The signal can be a one-shot rising, one-shot falling, or other suitable types of signals. In response to the provided signal, the NVDIMMs can then copy and persistently store data from a DRAM module to a corresponding flash memory module before power is removed from the NVDIMMs.

The foregoing data backup and persistence operations can present a high risk of data loss when certain system faults or errors are encountered. For instance, a fatal error in the processor and/or the memory controller can interrupt the foregoing backup operations. The interruption can prevent the NVDIMMs to enter into the self-refresh mode, and thus block initiation of data backup from the DRAM module to the flash memory module. Thus, data currently residing in the DRAM module may be lost due to a lack of refreshing. Such data loss can violate the data persistence guarantees of NVDIMMs.

Several embodiments of the disclosed technology can reduce the risk of such data loss during a system fault by eliminating or at least reducing reliance on the main processor and/or memory controller for data backup and persistence in the NVDIMMs or other types of hybrid memory devices. For example, a computing device (e.g., a server) in accordance with embodiments of the disclosed technology can include a switch (e.g., an I²C switch) located in a communications bus (e.g., an I²C bus) between the memory controller and NVDIMMs. The switch is configured to controllably disengage the memory controller from the NVDIMMs. The switch can also engage the NVDIMMs to a baseboard management controller ("BMC") of the computing device. Subsequently, the BMC can cause the NVDIMMs to initiate backup and persistence operations by transmitting a command via the I2C bus, or can provide a signal to the SAVE# pin on the NVDIMMs.

As such, fatal errors in the main processor or memory controller would not prevent backup and persistence of data in the DRAM module to the flash memory module of the NVDIMMs. The BMC are typically more reliable than the main processor because the BMC is a specialized service processor that monitors a physical state of the computing device, and not tasked to perform various computations or logic operations. Thus, several embodiments of the disclosed technology can improve performance and reliability of the computing device by utilizing the BMC for initiating and/or monitoring data backup and persistence in the NVDIMMs.

In other embodiments, the BMC can also be configured to monitor a status of the backup and persistence operation of the NVDIMMs. Based on the monitored status of the backup operation, the BMC can then allow the computing device to reset upon a successful completion of the backup operation. In the event of an error during the backup operation, the BMC can also be configured to create an entry in, for example, a system error log for diagnosis. In further embodiments, the switch can be configured to engage the NVDIMMs to a rack controller or other suitable types of controller in lieu of the BMC. The rack controller or other suitable types of controller can then perform the various operations described herein with respect to the BMC.

DETAILED DESCRIPTION

Figure 1:
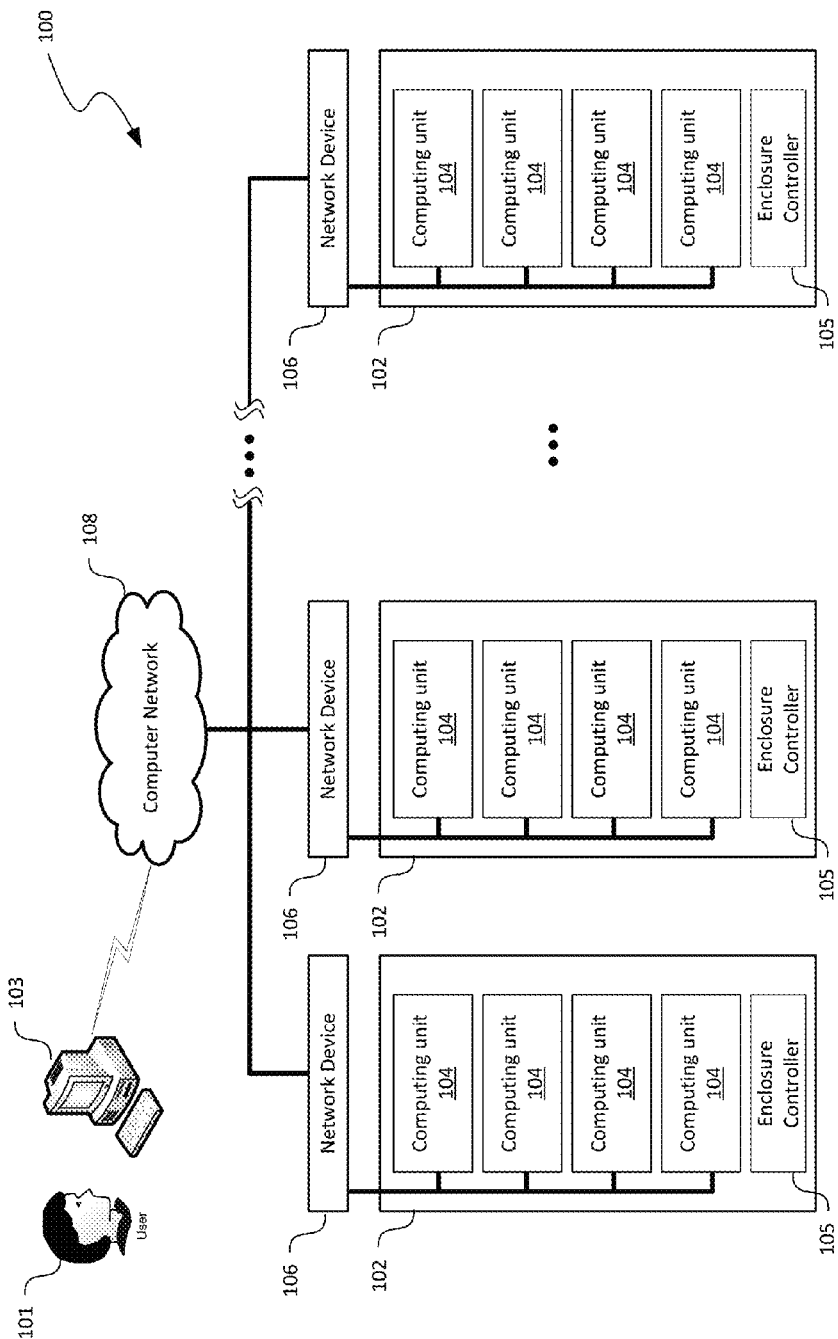
FIG. 1 is a schematic block diagram illustrating a computing system having computing units with memory backup management configured in accordance with embodiments of the present technology.

Various embodiments of computing systems, devices, components, modules, routines, and processes related to managing memory backup are described below. In the following description, example software codes, values, and other specific details are included to provide a thorough understanding of various embodiments of the present technology. A person skilled in the relevant art will also understand that the technology may have additional embodiments. The technology may also be practiced without several of the details of the embodiments described below with reference to FIGS. 1-5.

As used herein, the term "volatile memory" generally refers to a computer memory that requires power to maintain stored data. One example of volatile memory is DRAM, which can retain stored data when powered on via refreshing. When power is removed or interrupted, DRAM modules can lose stored data quickly due to a lack of refreshing. In contrast, the term "non-volatile memory" generally refers to a computer memory that can retain stored data even without power. Examples of non-volatile memory include read-only memory ("ROM"), flash memory (e.g., NAND or NOR solid state drives), and magnetic storage devices (e.g. hard disk drives).

Also used herein, the term "hybrid memory" generally refers to a computer memory that contains both volatile memory and non-volatile memory operatively coupled to one another. In certain implementations, the volatile memory can be used by, for example, a main processor of a computing device, and the non-volatile memory is primarily or exclusively used to facilitate or ensure that content in the volatile memory appears to be persistent. As such, the content in the volatile memory would not be lost when power is unexpectedly lost during operation. One example of hybrid memory is a type of NVDIMM (e.g., NVDIMM-N). In at least some implementations, an NVDIMM can include both DRAM and flash memory operatively coupled to one another. NVDIMM devices can also include a module controller configured to manage operations of the DRAM, flash memory, and operations therebetween. Even though the description herein uses NVDIMM as an example of a hybrid memory device, embodiments of the disclosed technology can also be implemented other suitable types of hybrid memory devices.

In certain computing systems, hybrid memory devices (e.g., NVDIMMs) are used for data storage due to fast data access, high data security, and low system crash recovery time. However, backup and persistence of data in hybrid memory devices conventionally rely on availability of main processors, memory controllers, and/or other components of a computing device. The reliance can present a risk of data loss when, for example, a main processor and/or memory controller experiences a fatal error. Such data loss can negatively affect user experience and degrade performance of the computing devices.

Several embodiments of the disclosed technology can at least reduce the risk of such data loss in hybrid memory devices by eliminating or at least reducing reliance of main processors and/or memory controllers for data backup and persistence in the hybrid memory devices. Thus, fatal errors in main processors and/or memory controllers would not prevent or interrupt backup and persistence of data in the hybrid memory devices, as described in more detail below with reference to FIGS. 1-5.

FIG. 1 is a schematic block diagram illustrating a computing system 100 having computing units with memory backup management configured in accordance with embodiments of the present technology. As shown in FIG. 1, the computing system 100 can include multiple computer enclosures 102 individually housing multiple computing units 104 interconnected by a computer network 108 via network devices 106. The computer network 108 can also be configured to interconnect the individual computing units 104 with one or more client devices 103 (only one is shown for illustration purposes). Even though particular configuration of the computing system 100 is shown in FIG. 1, in other embodiments, the computing system 100 can also include power supplies, cooling systems, power backup systems, and/or other suitable components.

The computer enclosures 102 can include structures with suitable shapes and sizes to house the computing units 104. For example, the computer enclosures 102 can include racks, drawers, containers, cabinets, and/or other suitable assemblies. In the illustrated embodiment in FIG. 1, four computing units 104 are shown in each computer enclosure 102 for illustration purposes. In other embodiments, individual computer enclosures 102 can also include ten, twenty, or any other suitable number of computing units 104. In further embodiments, the individual computer enclosures 102 can also include power distribution units, fans, intercoolers, and/or other suitable electrical and/or mechanical components (not shown).

The computing units 104 can include a server, a network storage device, a network communications device, or other suitable computing devices suitable for, e.g., a datacenter or other computing facilities. In certain embodiments, the computing units 104 can be configured to implement one or more cloud computing applications and/or services accessible by a user 101 using the client device 103 (e.g., a desktop computer, a smartphone, etc.) via, for instance, the computer network 108. The computing units 104 can individually include one or more hybrid memory devices 120 (shown in FIGS. 2A-2D) and can be configured to implement memory backup management in accordance with embodiments of the disclosed technology, as described in more detail below with reference to FIGS. 2A-2D.

As shown in FIG. 1, the individual computer enclosures 102 can also include an enclosure controller 105 configured to monitor and/or control a device operation of the computing units 104, power distribution units, fans, intercoolers, and/or other suitable electrical and/or mechanical components. As used herein, the phrase "device operation" generally refers to an operation that may be performed even in the absence of an operating system. For example, the enclosure controllers 105 can power up, power down, reset, power cycle, refresh, and/or perform other suitable device operations on a particular computing unit 104 in a computer enclosure 102. The enclosure controllers 105 can also allow device operations by a system administrator (not shown) via, for example, the computer network 108. In certain embodiments, the individual enclosure controllers 105 can include a rack controller configured to monitor operational status of the computing units 104 housed in a rack. One suitable example rack controller is the Smart Rack Controller (EMX) provided by Raritan of Somerset, N.J. In other embodiments, the individual enclosure controllers 105 can include a cabinet controller, a container controller, or other suitable types of controller.

In the illustrated embodiment, the enclosure controllers 105 individually include a standalone server or other suitable types of computing device located in a corresponding computer enclosure 102. In other embodiments, the enclosure controllers 105 can include a service of an operating system or application running on one or more of the computing units 104 in the individual computer enclosures 102. In further embodiments, the in the individual computer enclosures 102 can also include remote server coupled to the computing units 104 via an external network (not shown) and/or the computer network 108.

In certain embodiments, the computer network 108 can include twisted pair, coaxial, untwisted pair, optic fiber, and/or other suitable hardwire communication media, routers, switches, and/or other suitable network devices. In other embodiments, the computer network 108 can also include a wireless communication medium. In further embodiments, the computer network 108 can include a combination of hardwire and wireless communication media. The computer network 108 can operate according to Ethernet, token ring, asynchronous transfer mode, and/or other suitable link layer protocols. In the illustrated embodiment, the computing units 104 in the individual computer enclosure 102 are coupled to the computer network 108 via the network devices 106 (e.g., a top-of-rack switch) individually associated with one of the computer enclosures 102. In other embodiments, the computer network 108 may include other suitable topologies, devices, components, and/or arrangements.

In operation, the computing units 104 can receive user requests from the user 101 using the client device 103 via the computer network 108. For example, the user 101 can request a web search using the client device 103. After receiving the request, one or more of the computing units 104 can perform the requested web search and generate relevant search results based on the search request. The computing units 104 can then transmit the generated search results as network data to the client device 103 via the computer network 108 and/or other external networks (e.g., the Internet, not shown).

As described in more detail below with reference to FIGS. 2A-2D, the individual computing units 104 can include one or more hybrid memory devices 120, and can implement memory backup management in accordance with embodiments of the disclosed technology. The implemented memory backup management can at least reduce, or even eliminate reliance on main processors and/or memory controllers for performing data backup and persistence in the hybrid memory devices. As a result, network data such as the generated search results can be retained even when one or more of the computing units 104 experience system faults or errors in the main processors and/or memory controllers.

Figure 2A:
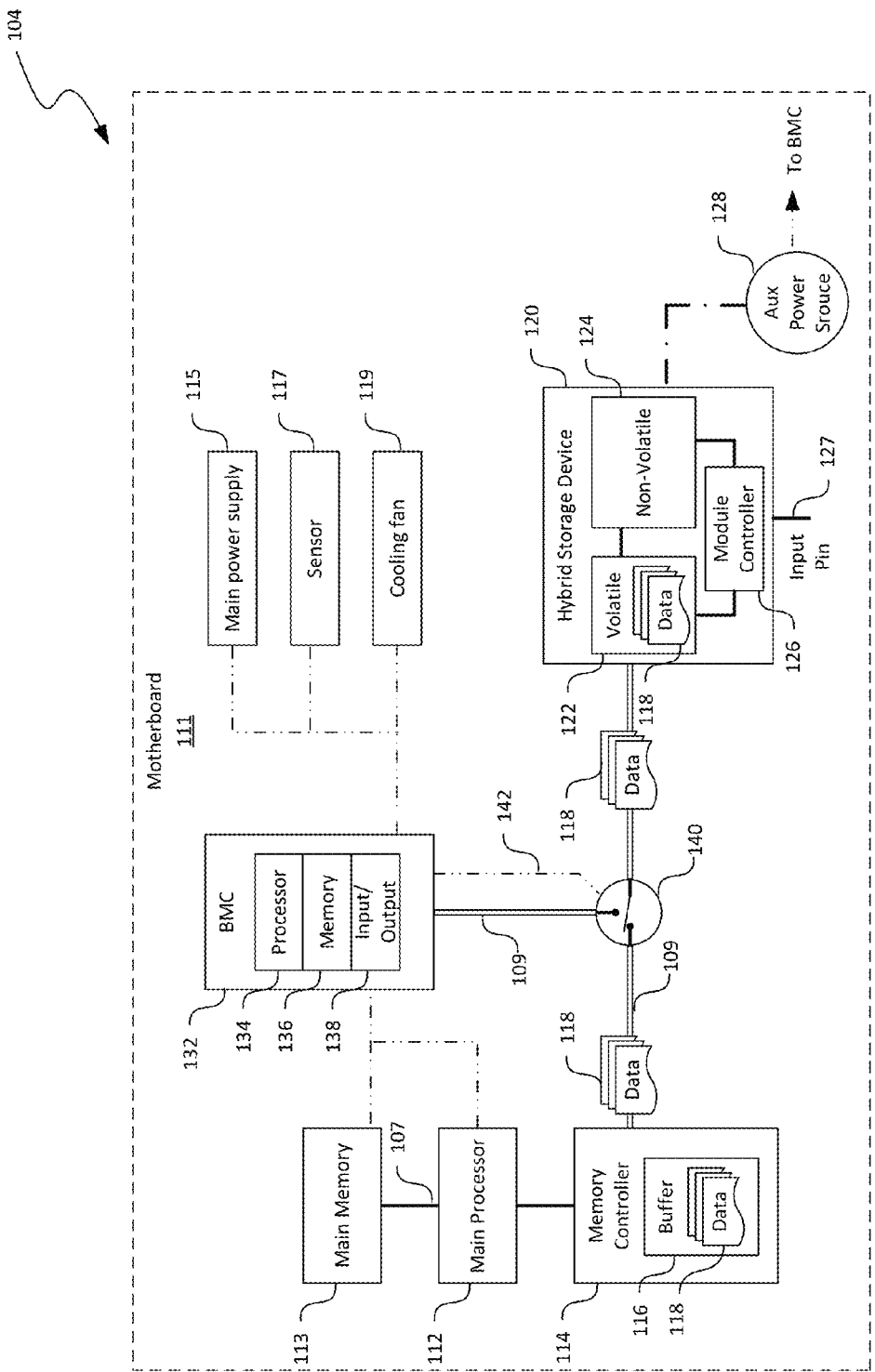
FIGS. 2A-2D are schematic block diagrams of a computing unit suitable for the computing system of FIG. 1 in various operational modes in accordance with embodiments of the present technology.

FIGS. 2A-2D are schematic block diagrams of a computing unit 104 suitable for the computing system 100 in FIG. 1 in various operational modes in accordance with embodiments of the disclosed technology. As shown in FIG. 2A, the computing unit 104 can include a motherboard 111 carrying a main processor 112, a main memory 113, a hybrid memory device 120, an auxiliary power source 128, and a BMC 132 operatively coupled to one another. The motherboard 111 can also carry a main power supply 115, a sensor 117 (e.g., a temperature or humidity sensor), and a cooling fan 119 (collectively referred to as "peripheral devices") coupled to the BMC 132.

Though FIGS. 2A-2D only show the motherboard 111 in phantom lines, the motherboard 111 can include a printed circuit board with one or more sockets configured to receive the foregoing or other suitable components described herein. In other embodiments, the motherboard 111 can also carry computer storage devices (e.g., a hard disk drive), indicators (e.g., light emitting diodes), communication components (e.g., a network interface module), platform controller hubs, complex programmable logic devices, and/or other suitable mechanical and/or electric components in lieu of or in addition to the components shown in FIGS. 2A-2D.

In further embodiments, the motherboard 111 can be configured as a computer assembly or subassembly having only portions of those components shown in FIGS. 2A-2D. For example, in one embodiment, the motherboard 111 can form a computer assembly containing only the main processor 112, main memory 113, and the BMC 132 without the hybrid memory device 120 being received in a corresponding socket. In other embodiments, the motherboard 111 can also be configured as another computer assembly with only the BMC 132. In further embodiments, the motherboard 111 can be configured as other suitable types of computer assembly with suitable components.

The main processor 112 can be configured to execute instructions of one or more computer programs by performing arithmetic, logical, control, and/or input/output operations, for example, in response to a user request received from the client device 103 (FIG. 1). The main processor 112 can include one or more microprocessors, field-programmable gate arrays, and/or other suitable logic devices. Even though only one main processor 112 is shown in FIG. 2A, in other embodiments, the computing unit 104 can include two, three, or any suitable number of main processors (not shown) operating in parallel, serial, or in other suitable fashions.

As shown in FIG. 2A, the main processor 112 can be coupled to a memory controller 114 having a buffer 116. The memory controller 114 can include a digital circuit that is configured to monitor and manage operations of the hybrid memory device 120. For example, in one embodiment, the memory controller 114 can be configured to periodically refresh the hybrid memory device 120. In another example, the memory controller 114 can also continuously, periodically, or in other suitable manners transmit or "write" data 118 in the buffer 116 to the hybrid memory device 120. In the illustrated embodiment, the memory controller 114 is integrated into the main processor 112. In other embodiments, the memory controller 114 can also include a digital circuit or chip separate from the main processor 112. One example of a suitable memory controller is the Intel® 5100 Memory Controller provided by Intel Corporation of Santa Clara, Calif.

The main memory 113 is a digital storage circuit directly accessible by the main processor 112 via, for example, a memory bus 107. The main processor 112 can continuously read instructions and/or data stored in the main memory 113 and executes the instructions as commanded. Any data actively operated on by the main processor 112 can also be stored in the main memory 113. In certain embodiments, the main memory 113 can include one or more DRAM modules (not shown). In other embodiments, the main memory 113 can also include magnetic core memory or other suitable types of memory.

The BMC 132 can be configured to monitor operating conditions and control device operations of various components on the motherboard 111. As shown in FIG. 2A, the BMC 132 can include a processor 134, a memory 136, and an input/output component 138 operatively coupled to one another. The processor 134 can include one or more microprocessors, field-programmable gate arrays, and/or other suitable logic devices. The memory 136 can include volatile and/or nonvolatile computer readable media (e.g., ROM, RAM, magnetic disk storage media, optical storage media, flash memory devices, EEPROM, and/or other suitable non-transitory storage media) configured to store data received from, as well as instructions for, the processor 136. In one embodiment, both the data and instructions are stored in one computer readable medium. In other embodiments, the data may be stored in one medium (e.g., RAM), and the instructions may be stored in a different medium (e.g., EEPROM). The input/output component 124 can include a digital and/or analog input/output interface configured to accept input from and/or provide output to other components of the BMC 132. One example of a suitable BMC is the Pilot 3 controller provided by Avago Technologies of Irvine, Calif.

As shown in FIG. 2A, the hybrid memory device 120 can include a volatile memory module 122, a non-volatile memory module 124, and a module controller 126 operatively coupled to one another. The volatile memory module 122 can include one or more DRAM modules or other suitable types of volatile memory components. The non-volatile memory module 124 can include one or more flash memory modules, static random access modules, optical storage devices, magnetic storage devices, or other suitable non-volatile memory components. The module controller 126 can include a microprocessor, a field programmable gate array, and/or other suitable types of logic device configured to manage operations of the volatile and non-volatile memory modules 122 and 124 as well as interoperation therebetween.

In certain embodiments, the hybrid memory device 120 can include one or more NVDIMMs. In such embodiments, the hybrid memory device 120 can include an input pin 127 (e.g., the SAVE# pin) configured to receive an input signal for initiating data backup from the volatile memory module 122 to the non-volatile memory module 124. The input signal can include a voltage signal, a current signal, or other suitable types of signal. In response to a received input signal, the module controller 126 can cause copying of data 118 from the volatile memory module 122 to the non-volatile memory module 124, as described in more detail below with reference to FIG. 2C. In other embodiments, the hybrid memory device 120 can also include other suitable types of computer readable storage devices.

The auxiliary power source 128 can be configured to controllably provide an alternative power source (e.g., 12-volt DC) to the hybrid memory device 120 than the main power supply 115 of the computing unit 104. In the illustrative embodiment, the auxiliary power source 128 includes a power supply that is separate from the main power supply 115. In other embodiments, the auxiliary power source 128 can also be an integral part of the main power supply 115. As shown in FIG. 2A, the BMC 132 can monitor and control operations of the auxiliary power source 128, as described in more detail below with reference to FIGS. 2B-2D below.

The peripheral devices can provide input to as well as receive instructions from the BMC 132 via the input/output component 138. For example, the main power supply 115 can provide power status, running time, wattage, and/or other suitable information to the BMC 132. In response, the BMC 132 can provide instructions to the main power supply 115 to power up, power down, reset, power cycle, refresh, and/or other suitable power operations. In another example, the cooling fan 119 can provide fan status to the BMC 132 and accept instructions to start, stop, speed up, slow down, and/or other suitable fan operations based on, for example, a temperature reading from the sensor 117. In further embodiments, the motherboard 111 may include additional and/or different peripheral devices.

As shown in FIG. 2A, the computing unit 104 can include a data bus 109 that interconnects the main processor 112, the hybrid memory device 120, and the BMC 132. In one embodiment, the data bus 109 can include an inter-integrated circuit bus or I²C bus as detailed by NXP Semiconductors N.V. of Eindhoven, the Netherlands. In other embodiments, the data bus 109 can also include a system management bus, RS-232, small computer system interface bus, or other suitable types of control and/or communications bus.

The computing unit 104 can also include a switch 140 on the data bus 109 between the main processor 112 and the hybrid memory device 120 and between the BMC 132 and the hybrid memory device 120. The switch 140 can be configured to controllably switch management and control of the hybrid memory device 120 between the memory controller 114 and the BMC 132. In one embodiment, the switch 140 can include an I²C switch, for example, a high-speed mux/switch provided by NXP Semiconductors N.V. of Eindhoven, the Netherlands. In other embodiments, the switch 140 can include other suitable types of programmable switch. In the illustrated embodiment, the BMC 132 is configured to control actions of the switch 140 via, for example, a digital output 142. In other embodiments, the enclosure controller 105 (FIG. 1) or other suitable components of the computing unit 104 can be configured to control actions of the switch 140.

In normal operation, the main processor 112 receives requested tasks from the client device 103 via, for example, the computer network 108 (FIG. 1). The main processor 112 can then perform the requested tasks and route generated results of network data to the client device 103. During processing, the switch 140 is in a first position that connects the main processor 112 to the hybrid memory device 120 via the data bus 109. As such, the memory controller 114 can monitor a status and manage refreshing of the volatile memory module 122 in the hybrid memory device 120, for example, every 60 milliseconds. During a write operation, the main processor 112 can instruct the memory controller 114 to temporarily store certain data 118 in the buffer 116 before transmitting or "writing" at least a portion of the stored data 118 to the volatile memory module 122 of the hybrid memory device 120 as bytes, blocks, or other data divisions. Because the volatile memory module 122 can provide fast data access, the main processor 112 and/or the memory controller 114 can rapidly write and store the data 118 in the volatile memory module 122.

In the illustrated embodiment in FIGS. 2A-2D, the BMC 132 is configured to implement embodiments of memory backup management to lower a risk of data loss during a system fault or error related to the main processor 112 and/or the memory controller 114. In other embodiments, the enclosure controller 105 (FIG. 1) or other suitable components of the computing system 100 can also be configured to implement similar operations as described below via the BMC 132 or other suitable communications channels. FIGS. 2A-2D illustrate certain operating modes of the computing unit 104 during stages of a memory backup operation in accordance with embodiments of the disclosed technology.

As shown in FIG. 2A, the BMC 132 can detect a fatal error of the main processor 112, the memory controller 114, or other components of the computing unit 104 via, for instance, a general input/output port (not shown). In certain embodiments, the fatal error can include an internal processor error or a quick power interconnect error related to the main processor 112 and/or the memory controller 114. In other embodiments, the fatal error can include other suitable types of system error related to main processor 112, the memory controller 114, or other components of the computing unit 104.

Figure 2B:
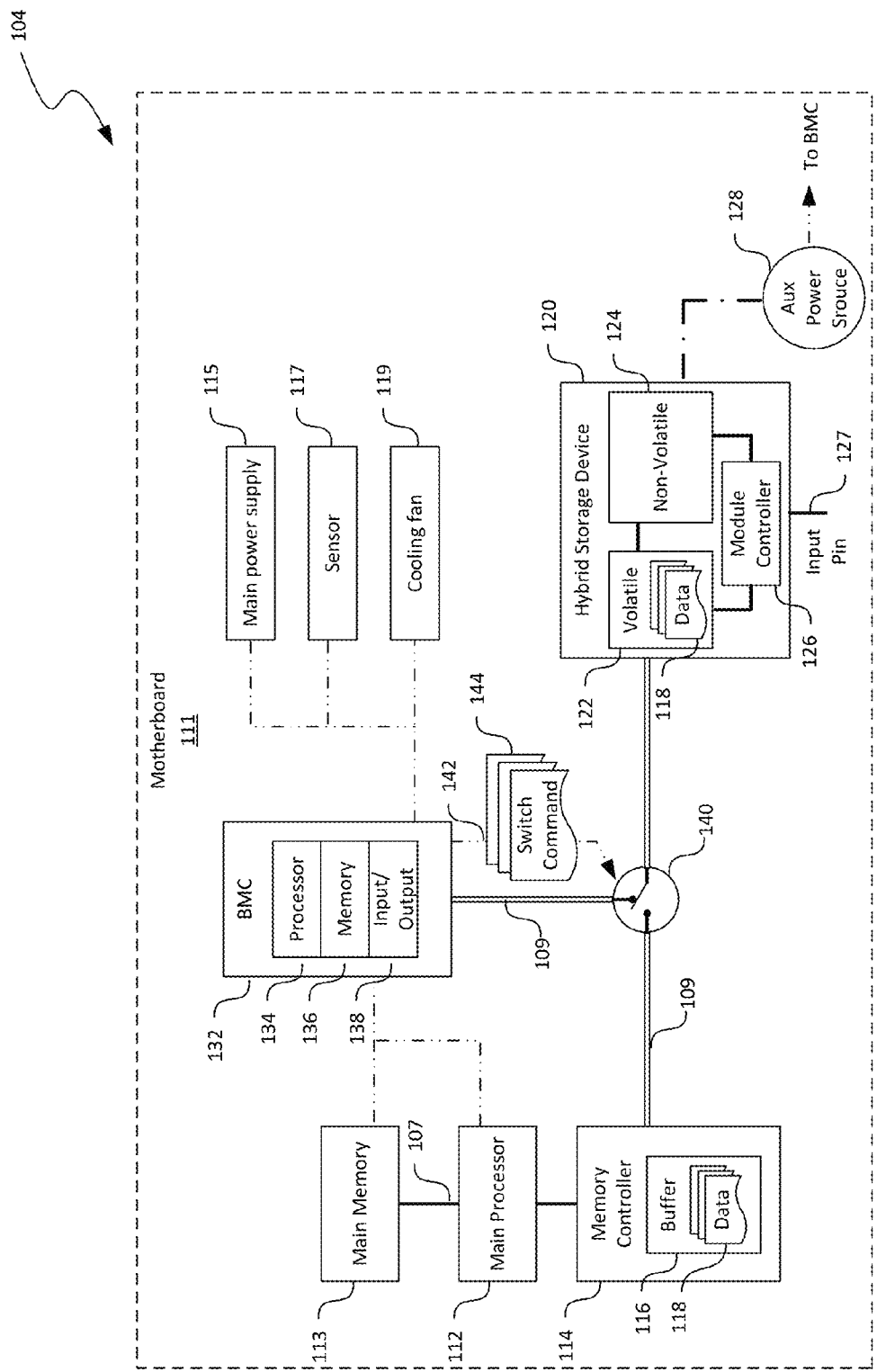

As shown in the illustrated embodiment of FIG. 2B, in response to the detected fatal error, the BMC 132 can issue a switch command 144 to the switch 140 via, for example, the digital output 142. In response to the received switch command 144, the switch 140 can disengage the hybrid memory device 120 from the memory controller 114 of the main processor 112, and engage the disengaged hybrid memory device 120 to the BMC 132. As such, the switch 140 is now in a second position that connects the BMC 132 to the hybrid memory device 120 via the data bus 109. In other embodiments, the BMC 132 can also issue the switch command 144 via the data bus 109, or via other suitable communications channels.

Figure 2C:
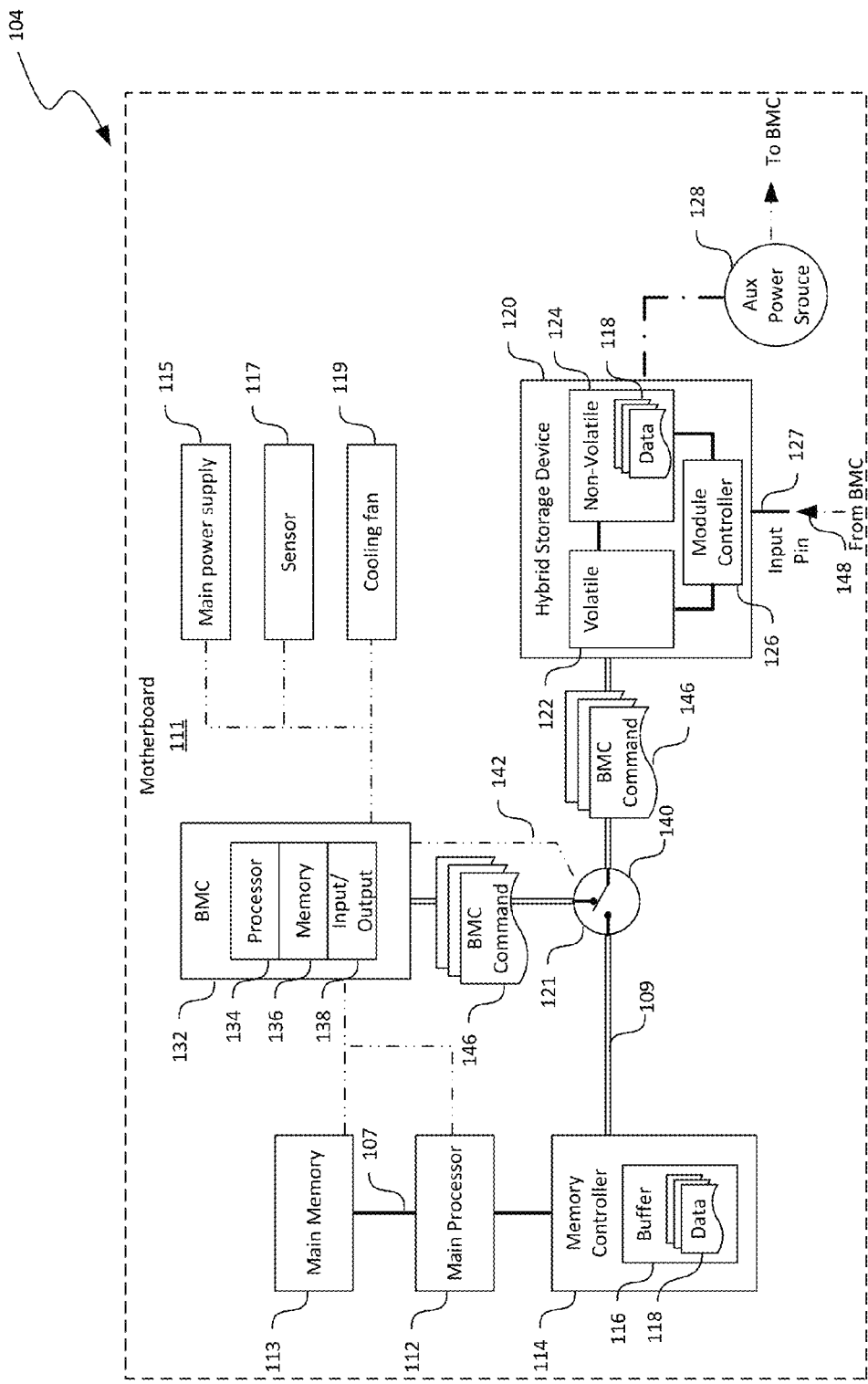

As shown in FIG. 2C, the BMC 146 can then issue one or more BMC commands 146 to the hybrid memory device 120 via the data bus 109. In certain embodiments, the BMC 132 can first issue a self-refresh command to the hybrid memory device 120. In response, the module controller 126 causes the hybrid memory device 120 to enter into a self-refresh mode by receiving power from the auxiliary power source 128, instead of from the memory controller 114, to refresh the volatile memory module 122. Subsequently, in certain embodiments, the BMC 132 can issue a backup command to the hybrid memory device 120 via the data bus 109. In other embodiments, instead of issuing the backup command via the data bus 109, the BMC 132 can also provide a signal 148 (e.g., a voltage signal) to the input pin 127 of the hybrid memory device 120. In response to either the backup command or the signal on the input pin 127, the module controller 126 can cause the data 118 in the volatile memory module 122 to be copied to the non-volatile memory module 124.

Figure 2D:
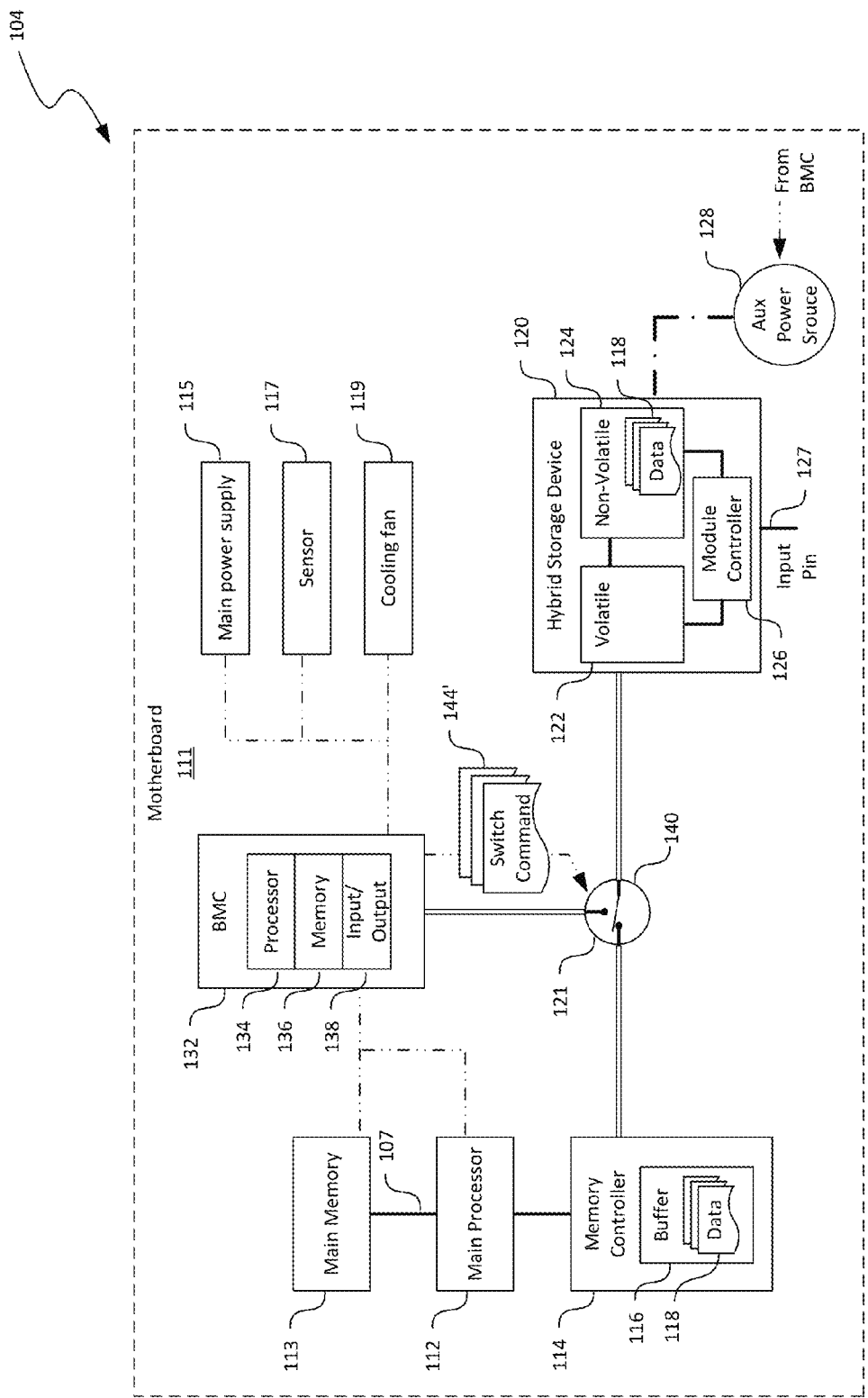

The module controller 126 can also monitor a status of the copying process and transmit the monitored status to the BMC 132 automatically or in response to a query (not shown) from the BMC 132. Once the BMC 132 detects that the data 118 has been successfully copied from the volatile memory module 122 to the non-volatile memory module 124, the BMC 132 can allow the auxiliary power source 128 to be turn off and can allow the computing unit 104 to be reset. For example, as shown in FIG. 2D, the BMC 132 can issue a command (not shown) to the auxiliary power source 128 to remove power supplied to the hybrid memory device 120. Optionally, the BMC 132 can also issue another switch command 144' to the switch 140. In response, the switch 140 can disengage the hybrid memory device 120 from the BMC 132, and re-engage the hybrid memory device 120 with the memory controller 114 of the main processor 112. Then, the BMC 132 can issue command to cause the computing unit 104 be reset by, for example, cycling power on the main power supply 115.

As described above with reference to FIGS. 2A-2D, operations of backup and persistence of the data 118 in the volatile memory module 122 to the non-volatile memory module 124 of the hybrid memory device 120 do not rely on availability of the main processor 112 or the memory controller 118. As such, even if the main processor 112 or the memory module 118 experiences a fatal error, the data 118 in the volatile memory module 122 can still be copied and backed up to the non-volatile memory module 124. Thus, a risk of data loss due to the fatal error of the main processor 112 and/or the memory controller 114 can be reduced or even eliminated.

Figure 3:
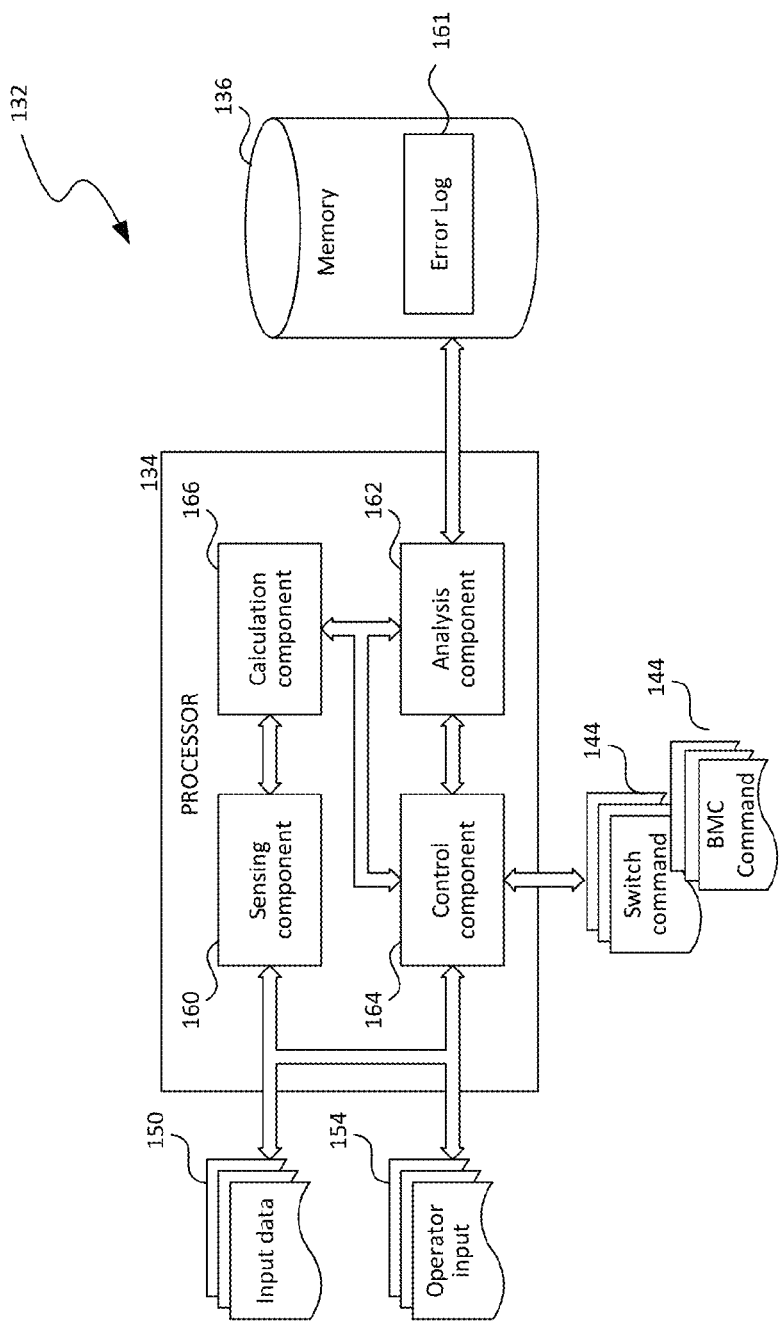
FIG. 3 is a block diagram showing software modules suitable for the baseboard management controller of FIGS. 2A-2D in accordance with embodiments of the present technology.

FIG. 3 is a block diagram showing certain computing system components suitable for the BMC 132 in FIGS. 2A-2D in accordance with embodiments of the disclosed technology. In FIG. 3 and in other Figures herein, individual software components, objects, classes, modules, and routines may be a computer program, procedure, or process written as source code in C, C++, C#, Java, and/or other suitable programming languages. A component may include, without limitation, one or more modules, objects, classes, routines, properties, processes, threads, executables, libraries, or other components. Components may be in source or binary form. Components may include aspects of source code before compilation (e.g., classes, properties, procedures, routines), compiled binary units (e.g., libraries, executables), or artifacts instantiated and used at runtime (e.g., objects, processes, threads).

Components within a system may take different forms within the system. As one example, a system comprising a first component, a second component and a third component can, without limitation, encompass a system that has the first component being a property in source code, the second component being a binary compiled library, and the third component being a thread created at runtime. The computer program, procedure, or process may be compiled into object, intermediate, or machine code and presented for execution by one or more processors of a personal computer, a network server, a laptop computer, a smartphone, and/or other suitable computing devices.

Equally, components may include hardware circuitry. A person of ordinary skill in the art would recognize that hardware may be considered fossilized software, and software may be considered liquefied hardware. As one example, software instructions in a component may be burned to a Programmable Logic Array circuit, or may be designed as a hardware circuit with appropriate integrated circuits. Equally, hardware may be emulated by software. Various implementations of source, intermediate, and/or object code and associated data may be stored in a computer memory that includes read-only memory, random-access memory, magnetic disk storage media, optical storage media, flash memory devices, and/or other suitable computer readable storage media excluding propagated signals.

In certain embodiments, as shown in FIG. 3, the BMC 132 can include instructions in the memory 136, which when executed by the processor 134 can cause the processor 134 to provide a sensing component 160, an analysis component 162, a control component 164, and a calculation component 166 interconnected with one other, as shown in FIG. 3. Each component may be a computer program, procedure, or routine written as source code in a conventional programming language, or one or more hardware electrical circuits.

The sensing component 160 can be configured to receive the input data 150 and converting the input data 150 into a suitable input value. For example, the sensing component 160 may receive an input from the sensor 117 (FIG. 1) and convert the received input data 150 into a temperature in Celsius. In another example, the sensing component 160 can receive an input from the main processor 112 (FIG. 2A), the memory controller 114 (FIG. 2A), or other components of the computing unit 104 (FIG. 2A), and convert the received input data 150 as an indication of a system error. In further examples, the sensing component 160 may perform other suitable conversions.

The calculation component 166 may include routines configured to perform various types of calculations to facilitate operation of other components of the BMC 132. For example, the calculation component 166 can include routines for averaging a temperature received from the sensing component 160. In other examples, the calculation component 166 can include linear regression, polynomial regression, interpolation, extrapolation, and/or other suitable subroutines. In further examples, the calculation component 166 can also include counters, timers, and/or other suitable routines.

The analysis component 162 can be configured to analyze the calculated parameters from the calculation component 166 or the sensing component 160 and determine whether a backup operation should be initiated on the hybrid memory device 120 (FIG. 2A). For example, the analysis component 162 can detect the indication of a system error and indicate that a backup operation should be initiated on the hybrid memory device 120. In other examples, the analysis component 162 can generate similar indication based, for instance, a sensed temperature of the computing unit 104, or perform other suitable analysis. In further examples, the analysis component 162 can analyze received data from the hybrid memory device 120, and determine whether an initiated backup operation is completed successfully. In response to determining that an initiated backup operation is completed successfully, the analysis component 162 can indicate that a reset may be performed on the computing unit 104. In response to determining that an initiated backup operation is not completed successfully, the analysis component 162 can generate an error log entry and store the generated error log entry in the error log 161 in the memory 136.

The control component 164 can be configured to control the operation of the switch 140 (FIG. 2A), the hybrid memory device 120, or other components of the computing unit 104 based on analysis results from the analysis component 162. For example, in one embodiment, in response to the analysis module 162 indicates that a backup operation should be initiated on the hybrid memory device 120, the control component 164 can generate and transmit the switch command 144 to the switch 140 via the data bus 109 (FIG. 2A). In another embodiment, control component 164 can also generate and transmit module controller commands to the hybrid memory device 120 to initiate the backup operation. In further embodiments, the control component 164 can also generate the switch command 144 and/or the BMC commands 146 based on operator input 154 and/or other suitable information.

Figure 4:
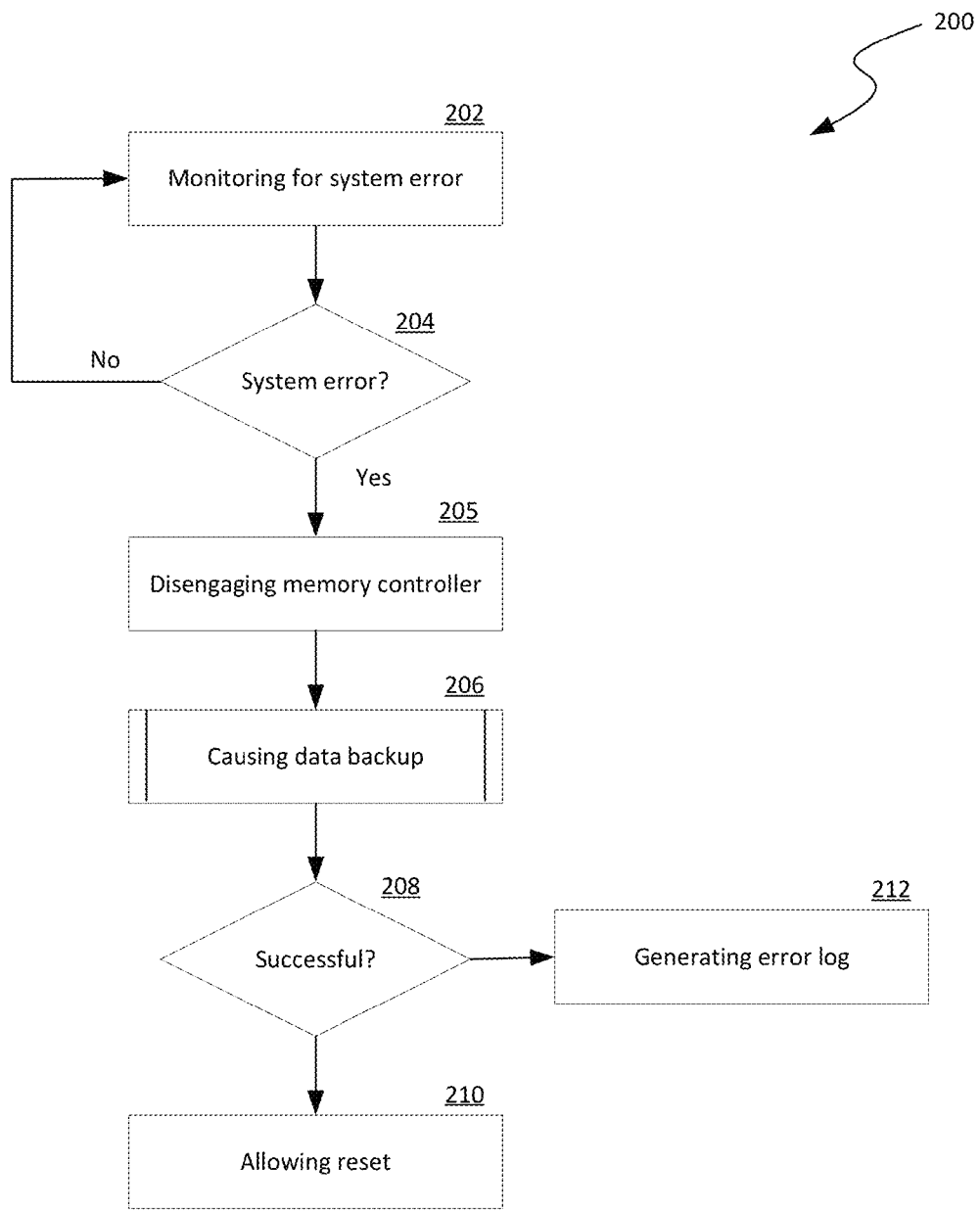
FIG. 4 is a flow diagram illustrating a process for managing memory backup in accordance with embodiments of the present technology.

FIG. 4 is a flow diagram illustrating a process 200 for managing memory backup in accordance with embodiments of the present technology. Even though the process 200 is described below with reference to the computing system 100 in FIG. 1 and the computing unit 104 in FIGS. 2A-2D, several embodiments of the process 200 may also be used in other computer systems or devices.

As shown in FIG. 4, the process 200 can include monitoring for a system error at stage 202. In certain embodiments, monitoring for a system error can include monitoring for an input signal on a general purpose input/output port of the BMC 132 (FIG. 2A) on a motherboard 111 (FIG. 2A) of a computing unit 104 (FIG. 2A). In other embodiments, monitoring for a system error can include receiving, for example, at the BMC 132, operating status parameters (e.g., processor loading, available memory, etc.), and compare the received operating status parameters to preset conditions or thresholds. In response to determining that the received operating status parameters violate the preset conditions or thresholds, the BMC 132, the enclosure controller 105 (FIG. 1), or other suitable components of the computing system 100 in FIG. 1 can indicate that a system error is detected. In further embodiments, monitoring for a system error can include any other suitable mechanisms for detecting a fault, alarm, or other abnormality of the computing unit 104.

The process 200 can then include a decision stage 204 to determine whether a system error has been detected. In response to determining that a system error has not been detected, the process 200 reverts to monitoring for a system error at stage 202. In response to determining that a system error has been detected, the process 200 proceeds to disengaging a memory controller (e.g., the memory controller 114 in FIG. 2A) from a storage device (e.g., the hybrid memory device 120 of FIG. 2A). In one example, disengaging the memory controller can include activating a switch (e.g., the switch 140 in FIG. 2A) on a communications bus (e.g., the data bus 109 in FIG. 2A) to disengage the memory controller 114 from communicating with and controlling the hybrid memory device 120. In other examples, the memory controller can be disengaged in other suitable manners.

The process 200 can then include causing a data backup in the storage device at stage 206. The data backup can copy and persistently store any data residing in, for example, the volatile memory module 122 in FIG. 2A to the non-volatile memory module 124 of the hybrid memory device 120. Various embodiments of causing a data backup are described in more detail below with reference to FIG. 5.

The process 200 can also include another decision stage 208 to determine whether the data backup has been completed successfully, for example, by utilizing the BMC 132 to monitor the data backup, as described above with reference to FIGS. 2C and 2D. In response to determining that the data backup has been completed successfully, the process 200 includes allowing reset of the computing unit 104 at stage 210, as described above with reference to FIG. 2D. In response to determining that the data backup has not been completed successfully, the process 200 includes generating and persistently storing an error log having an entry identifying, for example, a time, date, or other suitable parameters of the unsuccessful backup operation.

Figure 5:
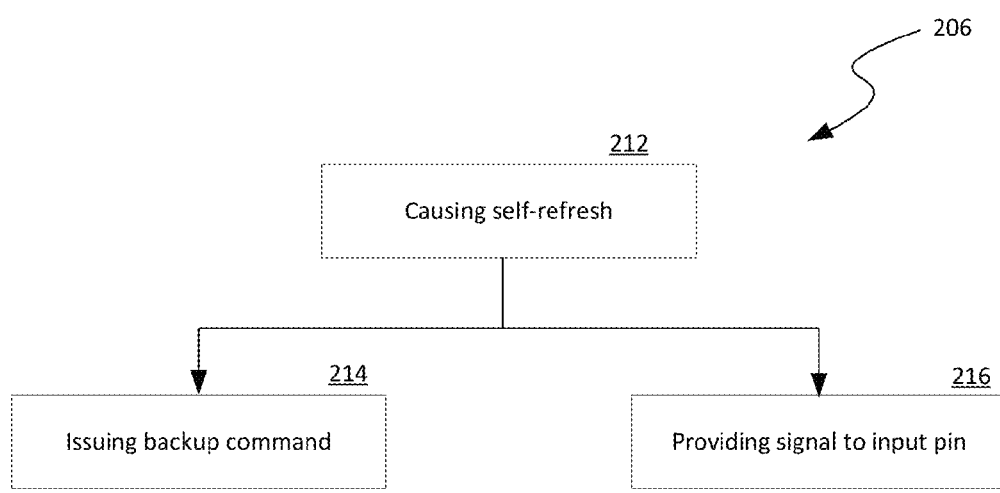
FIG. 5 is a flow diagram illustrating a process for performing data backup in accordance with embodiments of the present technology.

FIG. 5 is a flow diagram illustrating a process 206 for performing data backup in accordance with embodiments of the present technology. As shown in FIG. 5, the process 206 can include causing the storage device (e.g., the hybrid memory device 120 of FIG. 2A) to enter into a self-refresh mode by receiving power from, for instance, the auxiliary power source 148 in FIG. 2A. The process 206 can then include issuing a backup command to the storage device via the communications bus (e.g., the data bus 109 in FIG. 2A) at stage 214, or providing a signal (e.g., a voltage signal) to an input pin (e.g., the input pin 127 in FIG. 2A) of the hybrid memory device 120.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

We claim:

1. A method of managing memory backup in a computing device having a baseboard management controller, main processor, and a memory controller operatively coupled to a hybrid memory device by a data bus, the hybrid memory device having a volatile memory module, a non-volatile memory module, and a module controller operatively coupled to the volatile memory module and the non-volatile memory module, the method comprising:

monitoring, with the baseboard management controller, for a system error in the computing device; and in response to a system error being detected, with the baseboard management controller, operating a switch that is in the data bus intermediate between the memory controller and the hybrid memory device and between the baseboard management controller and the hybrid memory device to disengage the memory controller from communicating with and controlling the hybrid memory device and simultaneously engage the baseboard management controller for communicating with and controlling the hybrid memory device; and subsequent to the memory controller being disengaged from communicating with and controlling the hybrid memory device, with the baseboard management controller, causing the module controller of the hybrid memory device to copy data from the volatile memory module to the non-volatile memory module and persistently store in the non-volatile memory module of the hybrid memory device the copied data from the volatile memory module, without operating the main processor or the memory controller.

2. The method of claim 1, further comprising subsequent to disengaging the memory controller, causing the hybrid memory device to enter into a self-refresh mode in which the hybrid memory device receives power from an auxiliary power source operatively coupled to the hybrid memory device, the auxiliary power source being separated from a main power supply of the computing device.

3. The method of claim 1, further comprising:
subsequent to disengaging the memory controller, causing the hybrid memory device to enter into a self-refresh mode in which the hybrid memory device receives power from an auxiliary power source operatively coupled to the hybrid memory device and separated from a main power supply of the computing device; and
wherein causing the hybrid memory device to copy data includes causing the hybrid memory device to copy data from the volatile memory module to the non-volatile memory module after the hybrid memory device is in the self-refresh mode.

4. The method of claim 1 wherein:
causing the hybrid memory device to copy data includes transmitting, from the baseboard management controller, a command to the module controller of the hybrid memory device via the data bus, the command causing the module controller to copy data from the volatile memory module to the non-volatile memory module.

5. The method of claim 1 wherein:
causing the hybrid memory device to copy data includes providing a voltage or current signal to a pin of the hybrid memory device, the voltage or current signal causing the module controller to copy data from the volatile memory module to the non-volatile memory module.

6. The method of claim 1, further comprising:
determining whether copying of the data from the volatile memory module to the non-volatile memory module is completed; and
in response to determining that copying of the data from the volatile memory module to the non-volatile memory module is not completed, maintaining the auxiliary power source active and refreshing the volatile memory module with power from the auxiliary power source.

7. The method of claim 1, further comprising:
determining whether copying of the data from the volatile memory module to the non-volatile memory module is completed; and
in response to determining that copying of the data from the volatile memory module to the non-volatile memory module is completed successfully, performing at least one of the following:
allowing the auxiliary power source to be turned off; or
allowing the computing device to reset.

8. The method of claim 1 wherein:
the method further includes:
determining whether copying of the data from the volatile memory module to the non-volatile memory module is completed successfully; and
in response to determining that copying of the data from the volatile memory module to the non-volatile memory module is completed successfully, resetting the switch to reengage the memory controller with the hybrid memory device and subsequently allowing the computing device to reset.

9. A computing device, comprising:
a main processor operatively coupled to a memory controller with a buffer for holding data to be stored;
a hybrid memory device having a volatile memory module and a non-volatile memory module operatively coupled to one another;
a data bus between the memory controller and the volatile memory module of the hybrid memory device, wherein the memory controller is configured to write data held in the buffer into the volatile memory module of the hybrid memory device via the data bus;
wherein the data bus includes a switch intermediate between the memory controller and the volatile memory module of the hybrid memory device, the switch being configured to controllably disengage the memory controller from the hybrid memory device; and
a baseboard management controller ("BMC") having a digital output to the switch, wherein the BMC is configured to provide a signal at the digital output to cause the switch to disengage the memory controller from the hybrid memory device and simultaneously engage the BMC with the hybrid memory device.

10. The computing device of claim 9, wherein the BMC is configured to:
detect a system error related to the main processor or the memory controller; and
provide the signal at the digital output to cause the switch to disengage the memory controller from the hybrid memory device and engage the BMC with the hybrid memory device in response to a detected system error.

11. The computing device of claim 9, wherein the BMC is configured to:
detect a system error related to the main processor or the memory controller;
in response to a detected system error,
provide the signal at the digital output to cause the switch to disengage the memory controller from the hybrid memory device and engage the BMC with the hybrid memory device via the data bus; and
transmit a command to the hybrid memory device via the data bus, the command causes the hybrid memory device to copy data in the volatile memory module to the non-volatile memory module.

12. The computing device of claim 9, wherein the BMC is configured to:
detect a system error related to the main processor or the memory controller;
in response to a detected system error,
provide the signal at the digital output to cause the switch to disengage the memory controller from the hybrid memory device; and
provide a signal to an input pin of the hybrid memory device, the signal to the input pin causes the hybrid memory device to copy data in the volatile memory module to the non-volatile memory module.

13. The computing device of claim 9, wherein the BMC is configured to:
detect a system error related to the main processor or the memory controller;
in response to a detected system error,
provide the signal at the digital output to cause the switch to disengage the memory controller from the hybrid memory device;
subsequent to the memory controller being disengaged from the hybrid memory device, cause the hybrid memory device to copy data in the volatile memory module to the non-volatile memory module;

monitor a status of copying the data in the volatile memory module to the non-volatile memory module; and in response to that copying the data in the volatile memory module to the non-volatile memory module is completed successfully, allow the computing device to reset.

14. The computing device of claim 9, wherein the BMC is configured to:

detect a system error related to the main processor or the memory controller;

in response to a detected system error, provide the first signal at the digital output to cause the switch to disengage the memory controller from the hybrid memory device;

subsequent to the memory controller being disengaged from the hybrid memory device, cause the hybrid memory device to copy data in the volatile memory module to the non-volatile memory module;

monitor a status of copying the data in the volatile memory module to the non-volatile memory module; and in response to that copying the data in the volatile memory module to the non-volatile memory module is completed successfully, provide a second signal at the digital output to cause the switch to reengage the memory controller to the hybrid memory device.

15. A computer assembly, comprising:

a motherboard carrying:

a memory controller with a buffer for holding data;

a socket configured to receive a hybrid memory device having the volatile memory module and a non-volatile memory module operatively coupled to the volatile memory module;

a data bus between the memory controller and the socket, wherein the memory controller is configured to write data in the buffer into the volatile memory module of the hybrid memory device via the data bus in response to an instruction from the main processor;

a switch in the data bus and intermediate between the memory controller and the socket configured to receive the hybrid memory device, the switch being configured to controllably disengage the memory controller from the hybrid memory device when received in the socket; and a baseboard management controller ("BMC") having a digital output to the switch, wherein the BMC is configured to provide a signal at the digital output to cause the switch to disengage the memory controller from the hybrid memory device and engage the BMC with the hybrid memory device, wherein the switch is configured to controllably engage the BMC with the hybrid memory device.

* * * * *